(12) United States Patent
Ezell et al.

(10) Patent No.: US 9,811,113 B2
(45) Date of Patent: Nov. 7, 2017

(54) SYSTEM AND METHOD FOR SYNCHRONIZATION AMONG MULTIPLE PLL-BASED CLOCK SIGNALS

(71) Applicant: Linear Technology Corporation, Milpitas, CA (US)

(72) Inventors: Richard William Ezell, Lucas, TX (US); Eric Wright Mumper, Plano, TX (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 15/208,482

(22) Filed: Jul. 12, 2016

(65) Prior Publication Data

US 2017/0134031 A1 May 11, 2017

Related U.S. Application Data

(60) Provisional application No. 62/254,037, filed on Nov. 11, 2015.

(51) Int. Cl.
    *G06F 1/12* (2006.01)
    *H03L 7/23* (2006.01)
    *G06F 1/10* (2006.01)

(52) U.S. Cl.
    CPC ............ *G06F 1/12* (2013.01); *G06F 1/10* (2013.01); *H03L 7/23* (2013.01)

(58) Field of Classification Search
    CPC .............. G06F 1/10; G06F 1/12; H03L 7/23
    USPC ........ 327/141, 144, 145, 146, 147, 295, 297
    See application file for complete search history.

(56) References Cited

U.S. PATENT DOCUMENTS

| 4,484,296 A * | 11/1984 | Treise ................. G06F 1/0328 327/106 |
| 8,819,472 B1 | 8/2014 | Muscha et al. |
| 2007/0011482 A1* | 1/2007 | Sai ............................ H03L 7/23 713/500 |
| 2009/0256960 A1* | 10/2009 | Chen ........................ H03L 7/23 348/500 |

OTHER PUBLICATIONS

Barale, Francesco, "Frequency Dividers Design for Multi-GHz PLL Systems," Georgia Institute of Technology, dated Aug. 2008, 50 pages.

Perrott, Michael H., "Tutorial on Digital Phase-Locked Loops," CICC, 2009, 118 pages.

(Continued)

*Primary Examiner* — William Hernandez
(74) *Attorney, Agent, or Firm* — VLP Law Group LLP

(57) ABSTRACT

A method synchronizes clock signals generated by a system that includes multiple PLLs that are connected in parallel and output frequency dividers driven by the PLLs. The system receives a common frequency reference signal and a common synchronization signal. Each PLL may have a reference signal frequency divider. The reference frequency divider may be phase-reset, for example, by a transition to a first logic state in the synchronization signal, and the output frequency dividers are each phase-reset, for example, by a transition to a second logic state following the transition to the first logic state in the synchronization signal. The transition to the first logic state may be, for example, a rising edge.

9 Claims, 4 Drawing Sheets

(56) References Cited

OTHER PUBLICATIONS

Reehal, Gursharan, "A Digital Frequency Synthesizer Using Phase Locked Loop Technique," A Thesis, 1998, 84 pages.
Motorola, "DSP56300 Family Manual," Chapter 6, "PLL and Clock Generator," 12 pages.
Analog Devices, Inc., MT-086 Tutorial, "Fundamentals of Phase Locked Loops (PLLs)," 2009, 10 pages.
Texas Instruments, Inc., CGS700, "AN-1006 Phase-Locked Loop Based Clock Generators," Literature No. SNOA351, ed 2011, 8 pages.

* cited by examiner

SYSTEM AND METHOD FOR SYNCHRONIZATION AMONG MULTIPLE PLL-BASED CLOCK SIGNALS

CROSS REFERENCE TO RELATED APPLICATIONS

The present application relates to and claims priority of U.S. provisional patent application, Ser. No. 62/254,037, filed Nov. 11, 2015, entitled "System and Method for Synchronization Among Multiple PLL-based Clock Signals." The disclosure of the Application is hereby incorporated by reference in its entirety.

BACKGROUND OF THE INVENTION

1. Field of the Invention

The present invention relates to aligning or synchronizing multiple clock synthesizers or phase-locked loops (PLLs) that operate in parallel.

2. Discussion of the Related Art

Synchronization of timing signals is required, for instance, when aligning data sampling events in analog-to-digital converters that are driven by clock signals. Similarly, synchronization of timing signals is required to phase-align different carrier radio waves to achieve constructive interference. There are many systems that require—either because the number of clock signals they used or the spatial separations between the clocked devices therein—alignment of multiple clocking devices to a common time or phase.

Generally, a high frequency clocking signal may be synthesized from a lower frequency system reference signal ("reference signal $f_{REF}$") using a PLL. Often, using a PLL, a clock synthesizer creates a common high-frequency signal from reference signal $f_{REF}$. The common high-frequency signal is then used to drive individual frequency dividers to produce multiple signals of different frequencies. Because of their digital nature, the signals from the frequency dividers may have random output phases. The PLL may also make use of digital frequency dividers that have random phase characteristics. The PLL can remove some, but not all, phase uncertainties. Clock synchronization is required to consistently force a single predetermined phase relationship among the frequency dividers.

FIG. 1 illustrates the operations of prior art PLL 100. In FIG. 1, PLL 100 uses feedback signal $f_{VCO}$ to align the phase of voltage controlled oscillator (VCO) 101 to the phase of incoming frequency reference signal $f_{REF}$. As shown, feedback signal $f_{VCO}$ is output from VCO 101 to drives frequency divider 102, which has a frequency division ratio N. Frequency divider 102 is referred to as the "N-divider" or the "feedback divider". Frequency reference signal $f_{REF}$ is provided to frequency divider 103, which has a frequency division ratio R. Frequency divider 103 is referred to as the "R-divider" or the "reference divider." Phase detector 104 compares the output signals of the R-divider and the N-divider to adjust the frequency of VCO 101 so as to align the phases of the output signals of the R-divider and the N-divider. In steady state, feedback signal $f_{vco}$ and reference signal $f_{REF}$ are related by:

$$f_{VCO} = f_{REF} \times \frac{N}{R}$$

In FIG. 1, signal $f_{OUT}$ represents an additional frequency division provided by output frequency divider 105, which reduces the frequency of signal $f_{vco}$ by a factor of M, M≥2:

$$f_{OUT} = f_{REF} \times \frac{N}{R \times M}$$

The uncertainty of the starting state of frequency divider 103 (i.e., the R-divider) causes the phase of signal $f_{VCO}$ relative reference signal $f_{REF}$ to be indeterminate. An additional degree of phase uncertainty is in signal $f_{OUT}$, due to output frequency divider 105.

The output signal of a digital frequency divider has one of K possible phases for a given frequency division ratio K. For K=1, there is no phase uncertainty, as there is only one phase possibility. Phase uncertainty occurs when K is greater than or equal to 2. Thus, to provide a deterministic phase relationship between $f_{vco}$ and $f_{REF}$, the R-divider must have a known phase at a known time. FIG. 2 illustrates the two possible phases for $f_{vco}$, as a result of phase uncertainty in the R-divider. As shown in FIG. 2, for frequency division ratios R=2 and N=5, $f_{VCO}$=2.5×$f_{REF}$. A similar phase uncertainty is present in signal $f_{OUT}$ with respect to $f_{vco}$ and $f_{REF}$, where output frequency divider 105 has a frequency division ratio M≥2.

U.S. Pat. No. 8,819,472 teaches clock synchronization of multiple cascaded dividers in a series configuration ("series-connected clock synchronization system"), using a common synchronization signal. In the '472 patent, a "clock tree" of clock signals is created by connecting dividers in series, with each divider having an input signal and multiple output signals. Each cascaded divider adds timing uncertainty as a result of variations of clock propagation delay, and as a result of noise in the form of clock jitter. The resulting overall noise and clock uncertainty depend upon the number of dividers present between the reference signal and the output clock signal in question. The '472 patent teaches a method for creating a deterministic phase relationship. FIG. 3 shows a series-connected clock synchronization system according to teachings of the '472 patent.

SUMMARY OF THE INVENTION

According to one embodiment of the present invention, a method synchronizes clock signals generated by a system that includes multiple PLLs that are connected in parallel and output frequency dividers driven by the PLLs. The system receives a common frequency reference signal and a common synchronization signal.

In one embodiment, each PLL has a reference signal frequency divider; the system takes advantage of the logic state transitions of the synchronization signal to reset the reference signal divider of each PLL and to reset one or more output frequency dividers that receives phase-locked signals from the PLL. The reference frequency divider may be phase-reset, for example, by a transition to a first logic state in the synchronization signal, and the output frequency dividers are each phase-reset, for example, by a transition to a second logic state following the transition to the first logic state in the synchronization signal. The transition to the first logic state may be, for example, a rising edge.

In one embodiment, the output frequency dividers are provided without cascading frequency dividers.

A clock signal of the present invention has reduced clock jitter and timing uncertainty, as compared to a series-connected clock synchronization system, as there is only a single frequency divider between the frequency reference signal and any output clock signal. As the output signals of a PLL typically have frequencies that are significantly higher than the frequency of the input frequency reference signal, the number of high-frequency interconnections required under the present invention among frequency dividers is reduced, thus providing a significant advantage in reduced signal propagation loss and easier signal distribution.

The present invention is better understood upon consideration of the detailed description below in conjunction with the accompanying drawings.

DETAILED DESCRIPTION OF THE PREFERRED EMBODIMENTS

Figure 4:
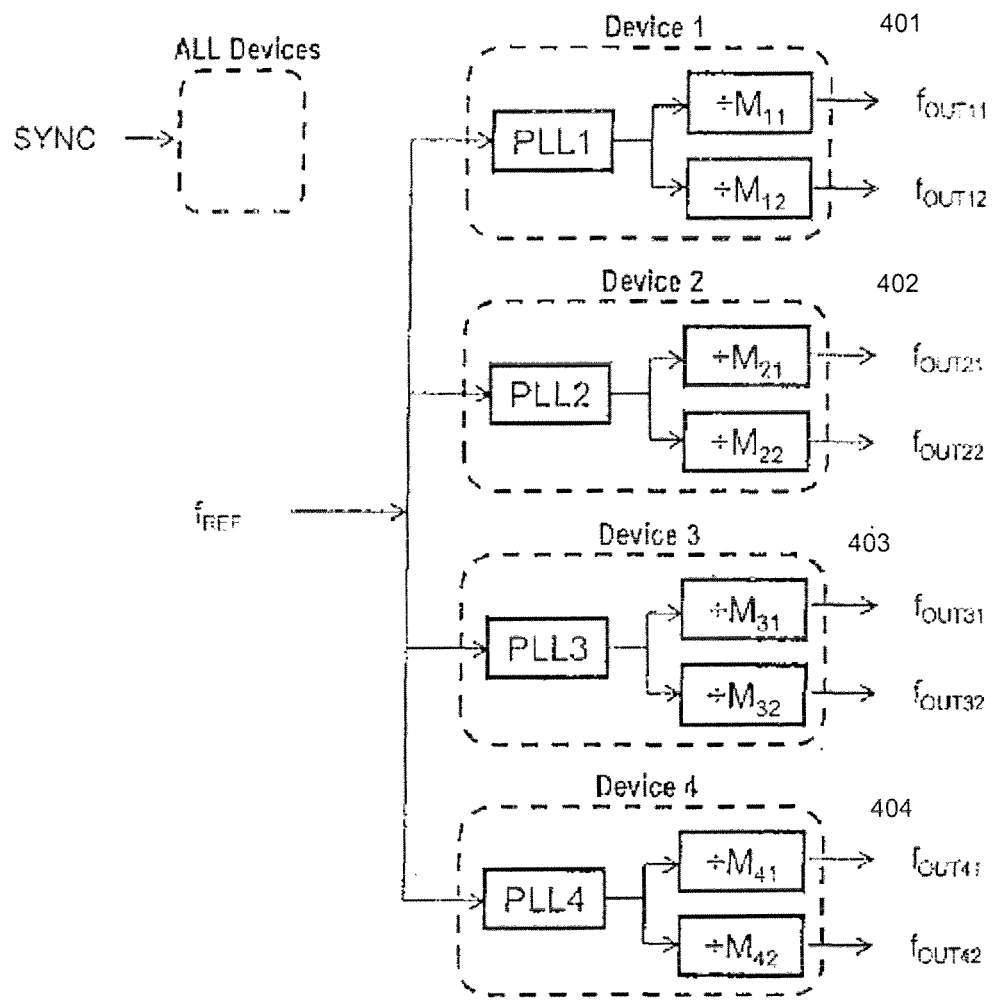
FIG. 4 shows system 400, which uses PLLs connected in parallel, according to one embodiment of the present invention.

FIG. 4 shows system 400, which uses PLLs connected in parallel, according to one embodiment of the present invention. As shown in FIG. 4, a number of clock generators 401-404 receive frequency reference signal $f_{REF}$. Each of clock generators 401-404 includes a PLL (e.g., PLL1, PLL2, PLL3 or PLL4), which provides an output signal to multiple output frequency dividers (e.g., one or more output frequency dividers $M_{11}$, $M_{12}$, $M_{21}$, $M_{22}$, $M_{31}$, $M_{32}$, $M_{41}$, or $M_{42}$) to provide output signals of various frequencies (e.g., output signals $f_{OUT11}$, $f_{OUT12}$, $f_{OUT21}$, $f_{OUT22}$, $f_{OUT31}$, $f_{OUT32}$, $f_{OUT41}$ and $f_{OUT42}$). Synchronization signal SYNC is provided to all clock generators. In FIG. 4, PLL1, PLL2, PLL3 and PLL4 each include a reference signal frequency divider (i.e., an R-divider).

As described above, to align the output signals of PLLs, the signals of their respective reference signal R-dividers must be aligned. When an output signal of a PLL drives an output frequency divider to provide an output signal, the output signals must be also be aligned. According to one embodiment of the present invention, the R-dividers are aligned using a first logic state (e.g., the logic-high state) of a synchronization signal, and the output frequency dividers are aligned using a second logic state (the logic-low state) of the synchronization signal.

Figure 1:
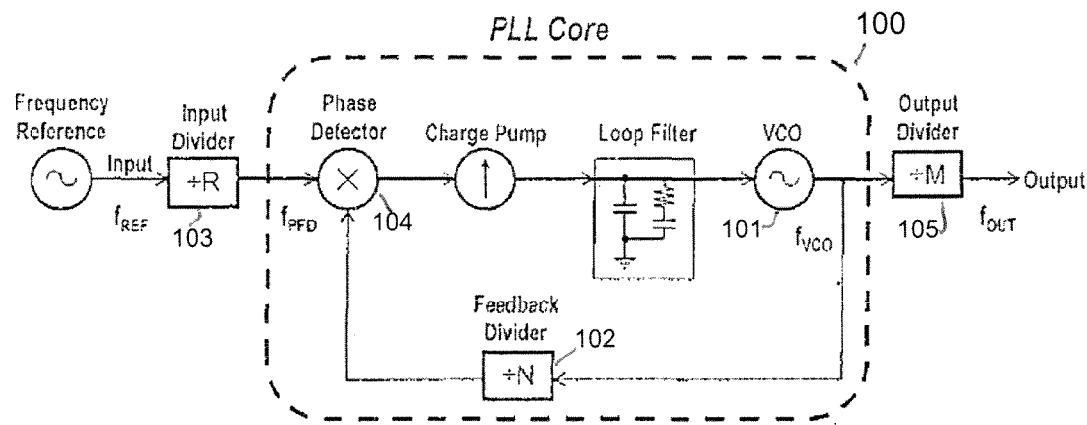
FIG. 1 illustrates the operations of prior art PLL 100.
Figure 2:
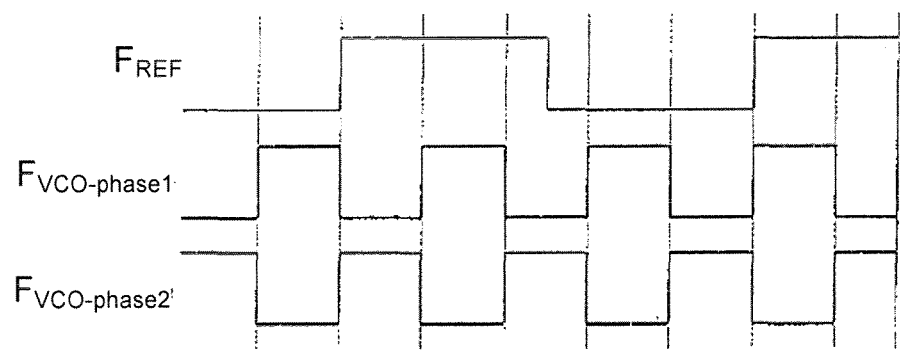
FIG. 2 illustrates the two possible phases for $f_{vco}$, as a result of phase uncertainty in the R-divider.
Figure 3:
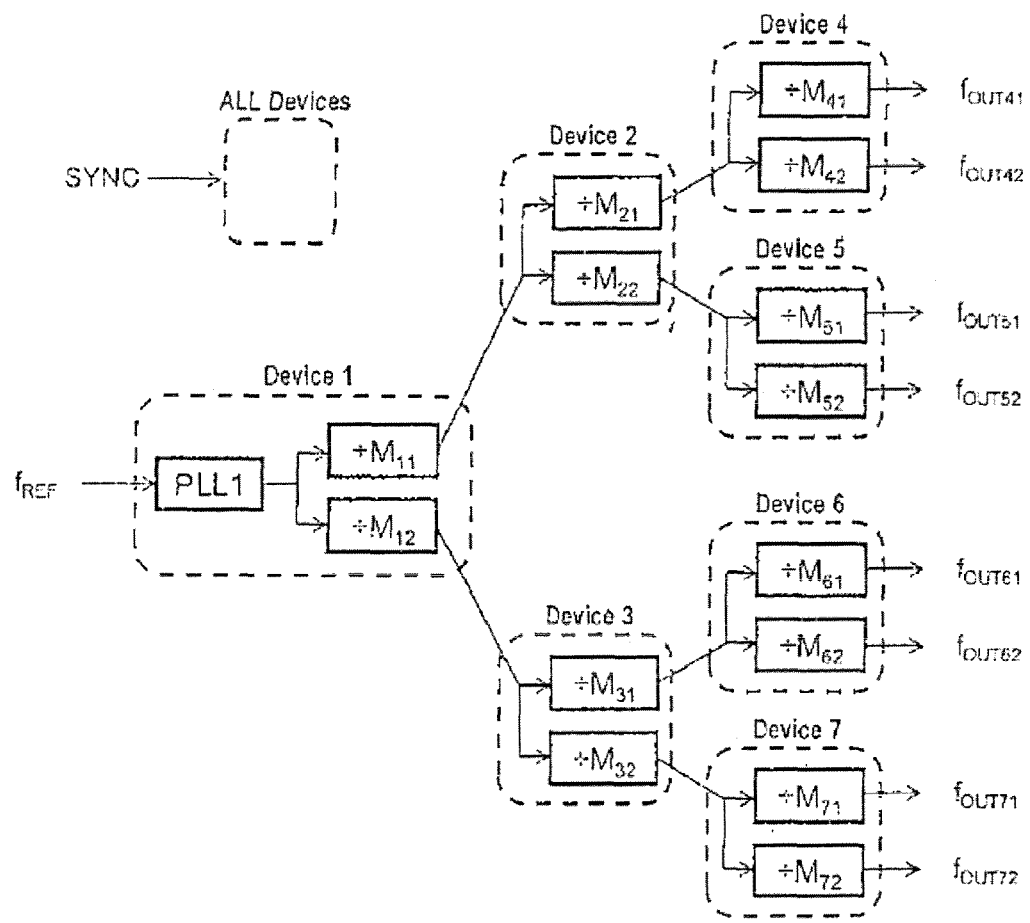
FIG. 3 shows a prior art series-connected clock synchronization system.
Figure 5:
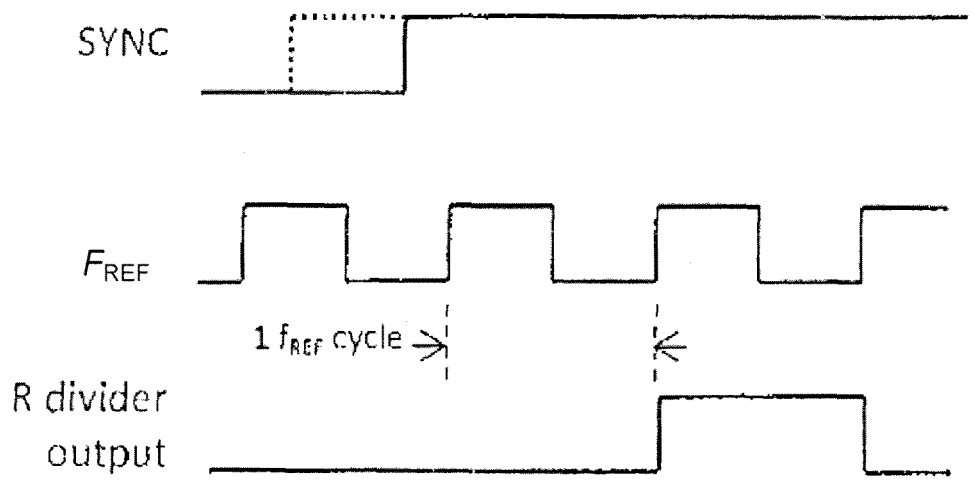
FIG. 5 illustrates synchronization of all R-divider output signals for $R \geq 2$, and for an R value that is common to all the PLLs, using a rising edge of common synchronization signal SYNC, in accordance with one embodiment of the present invention.

FIG. 5 illustrates synchronization of all R-divider output signals for $R \geq 2$, and for an R-value (i.e., the frequency division ratio R of the R-divider) that is common to all the PLLs, using a rising edge of synchronization signal SYNC, in accordance with one embodiment of the present invention. (As shown in FIG. 1, above, the output signal of the R-divider is the input signal to the corresponding PLL). In this embodiment, the timing of the rising edge transition (i.e., change of logic state from the logic low state to the logic high state) of synchronization signal SYNC must meet both setup and hold timing requirements of the rising edge of frequency reference $f_{REF}$. In FIG. 5, the dash-line rising edge transition of synchronization signal SYNC indicates the earliest time after the rising edge of frequency reference signal $f_{REF}$ that meets frequency reference signal $f_{REF}$'s hold time requirement, and the solid-line rising edge transition of synchronization signal SYNC indicates the latest time prior to the rising edge of frequency reference signal $f_{REF}$ that meets frequency reference signal $f_{REF}$'s setup time requirement. Thus, the time between the dash-line rising edge and the solid-line rising edge of synchronization signal SYNC is the window during which the setup and hold timing requirements of frequency reference signal $f_{REF}$ are met.

The rising edge of synchronization signal SYNC resets the timing of the output signal of an R-divider, as shown in FIG. 5. At the same time, the rising edge transition of synchronization signal SYNC disables the output frequency dividers, which are reset only at the next falling edge of synchronization signal SYNC. In other words, during the duration of the logic high state of synchronization signal SYNC, the output frequency dividers are disabled. The timing reset of the R-divider may cause the corresponding PLL to lose its phase-lock momentarily. However, the phase-locked condition will be reestablished after several PLL loop time constants.

In this example, as the R-value is common to all PLLs, the rising edge transition of synchronization signal SYNC causes the R-dividers of all the PLLs to reset after one $f_{REF}$ clock cycle. At this time, all the output signals of the R-dividers are synchronized. Once the PLLs return to steady state operation (i.e., the phase-locked states are all reestablished), the output signals of the PLLs are all phase-aligned, as each PLL locks into the aligned phase of its respective frequency-divided reference signal.

Figure 6:
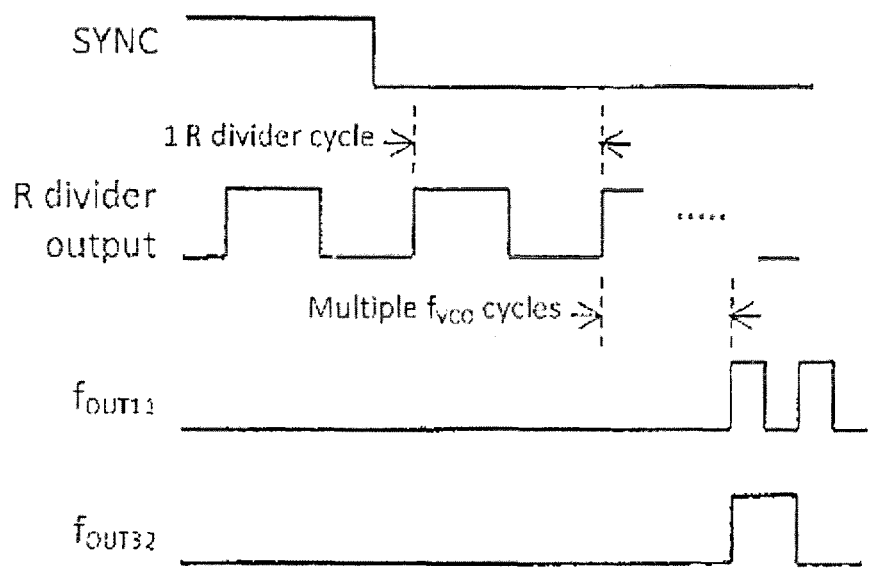
FIG. 6 illustrates the timing relation between the falling edge transition of synchronization signal SYNC and each of output frequency signals $f_{OUT11}$ and $f_{OUT32}$, relative to a rising edge of the output signal of a R-divider, in accordance with one embodiment of the present invention.

By a falling edge transition (i.e., change of logic state from the logic high state to the logic low state) of synchronization signal SYNC, the rising edges of the output signals of the PLLs (e.g., PLL1, PLL2, PLL3 and PLL4) are received into the input terminals of the output frequency dividers (e.g., output frequency dividers $M_{11}$, $M_{12}$, $M_{21}$, $M_{22}$, $M_{31}$, $M_{32}$, $M_{41}$, and $M_{42}$). Relative the first rising edge of R-divider output after the falling edge transition of the synchronization signal SYNC, the output signal of each output frequency divider is reset after one R-divider cycle and a predetermined number of cycles of feedback signal $f_{VCO}$. FIG. 6 illustrates the timing relation between the falling edge transition of synchronization signal SYNC and each of output frequency signals $f_{OUT11}$ and $f_{OUT32}$, relative to a rising edge of the output signal of a R-divider, in accordance with one embodiment of the present invention. Thereafter, the rising edges of all output frequency dividers are phase-aligned to each other (i.e., with rising edges coincident periodically) and to the output signals of the R-divider, regardless of their respective frequency division ratios.

In some embodiments, the R-value may a proper fraction (e.g., R=½).

The detailed description above is provided to illustrate specific embodiments of the present invention and is not intended to be limiting. Numerous variations and modifications of the present invention are possible. The present invention is set forth in the accompanying claims.

We claim:

1. A clock generation system receiving a reference frequency signal and a synchronization signal having a first logic state and a second logic state, comprising a plurality of clock generators connected in parallel to receive the reference frequency signal, wherein each clock generator comprises:
   a reference frequency divider which receives the reference frequency signal and provides a frequency-divided reference signal;
   a phase-locked loop which receives the frequency-divided reference signal and provides a phase-locked signal that is phase-locked to the frequency-divided reference signal; and
   an output frequency divider that receives the phase-locked signal and provides an output signal of a predetermined frequency that is a function of the frequency of the reference frequency signal, wherein the reference frequency divider is phase-reset by a transition to the first logic state in the synchronization signal, and wherein the output frequency divider is phase-reset by a transition to the second logic state following the transition to the first logic state in the synchronization signal.

2. The clock generation system of claim 1, wherein the transition to the first logic state is a rising edge.

3. The clock generation system of claim 1, wherein the phase-locked loop comprises a voltage controlled oscillator and a feedback frequency divider.

4. The clock generation system of claim 1, wherein the output frequency dividers of the clock generation system are provided without cascading frequency dividers.

5. A method for clock generation, comprising:
   providing a reference frequency signal and a synchronization signal having a first logic state and a second logic state; and
   connecting a plurality of clock generators in parallel to receive the reference frequency signal, wherein each clock generator is provided according to the steps:
      providing a reference frequency divider which receives the reference frequency signal and provides a frequency-divided reference signal, the reference frequency divider provided to be phase-reset by a transition to the first logic state in the synchronization signal;
      providing a phase-locked loop which receives the frequency-divided reference signal and provides a phase-locked signal that is phase-locked to the frequency-divided reference signal; and
      providing an output frequency divider that receives the phase-locked signal and provides an output signal of a predetermined frequency that is a function of the frequency of the reference frequency signal, the output frequency divider being provided to be phase-reset by a transition to the second logic state following the transition to the first logic state in the synchronization signal.

6. The method of claim 5, wherein the transition to the first logic state is a rising edge.

7. The method of claim 5, wherein the function is a multiple or a fraction.

8. The method of claim 5, wherein the phase-locked loop comprises a voltage controlled oscillator and a feedback frequency divider.

9. The method of claim 5, wherein the output frequency dividers of the clock generators are provided without cascading frequency dividers.

* * * * *